(12) United States Patent
Lin et al.

(10) Patent No.: US 12,489,021 B1
(45) Date of Patent: Dec. 2, 2025

(54) DETERMINING A DENSITY OF THROUGH-SILICON VIAS IN INTEGRATED CIRCUITS

(71) Applicant: Synopsys, Inc., Sunnyvale, CA (US)

(72) Inventors: I-Jye Lin, New Taipei (TW); Gary K. Yeap, Fremont, CA (US)

(73) Assignee: Synopsys, Inc., Sunnyvale, CA (US)

( * ) Notice: Subject to any disclaimer, the term of this patent is extended or adjusted under 35 U.S.C. 154(b) by 447 days.

(21) Appl. No.: 18/047,977

(22) Filed: Oct. 19, 2022

Related U.S. Application Data

(60) Provisional application No. 63/262,957, filed on Oct. 22, 2021.

(51) Int. Cl.
| | |
|---|---|
| *H01L 21/66* | (2006.01) |
| *H01L 23/00* | (2006.01) |
| *H01L 23/48* | (2006.01) |
| *H01L 25/065* | (2023.01) |
| *H10D 88/00* | (2025.01) |

(52) U.S. Cl.
CPC ............ *H01L 22/12* (2013.01); *H01L 23/481* (2013.01); *H01L 24/16* (2013.01); *H01L 25/0652* (2013.01); *H10D 88/00* (2025.01); *H01L 2224/16245* (2013.01); *H01L 2225/06541* (2013.01); *H01L 2225/06596* (2013.01)

(58) Field of Classification Search
CPC ....... H01L 22/12; H01L 23/481; H01L 24/16; H01L 25/0652
See application file for complete search history.

(56) References Cited

U.S. PATENT DOCUMENTS

| | | | | |
|---|---|---|---|---|
| 6,157,903 A | * | 12/2000 | Hu ........................ | G06F 30/33 |
| | | | | 703/14 |
| 6,496,972 B1 | * | 12/2002 | Segal ..................... | G06F 30/30 |
| | | | | 716/108 |
| 6,578,176 B1 | * | 6/2003 | Wang .................... | G06N 3/126 |
| | | | | 716/133 |
| 8,015,520 B2 | * | 9/2011 | McElvain .......... | G06F 30/3323 |
| | | | | 716/106 |
| 8,610,281 B1 | * | 12/2013 | Nguyen ............... | H10D 88/101 |
| | | | | 257/770 |
| 9,761,533 B2 | * | 9/2017 | Chaware ............. | H01L 25/0655 |

(Continued)

FOREIGN PATENT DOCUMENTS

| | | | | | |
|---|---|---|---|---|---|
| CN | 117038636 A | * | 11/2023 | ............. | H01L 25/18 |
| CN | 118156239 A | * | 6/2024 | ......... | H01L 25/0657 |

(Continued)

*Primary Examiner* — Laura M Menz
(74) *Attorney, Agent, or Firm* — Weaver Austin Villeneuve & Sampson LLP

(57) ABSTRACT

Techniques for determining a density of through-silicon vias (TSVs) in a three-dimensional (3D) stacked die are disclosed. In some embodiments, such techniques may include obtaining first power consumption information associated with a first die of the 3D stacked die; obtaining second power consumption information associated with a second die of the 3D stacked die; identifying, on the first die, an area associated with the second die, the identified area overlapping an area associated with the first die; and determining a density of TSVs for the identified area based at least on the first power consumption information and the second power consumption information.

14 Claims, 10 Drawing Sheets

(56) References Cited

U.S. PATENT DOCUMENTS

| | | | | |
|---|---|---|---|---|
| 9,768,145 | B2* | 9/2017 | Yu | H01L 23/49811 |
| 9,805,977 | B1* | 10/2017 | Sukumaran | H01L 21/76898 |
| 9,978,717 | B2* | 5/2018 | Kuroda | H01L 21/486 |
| 11,093,673 | B2* | 8/2021 | Eghbal | G06F 11/261 |
| 11,217,535 | B2* | 1/2022 | Elsherbini | H01L 24/19 |
| 11,367,689 | B2* | 6/2022 | Elsherbini | H01L 25/18 |
| 11,694,940 | B1* | 7/2023 | Mathuriya | G11C 11/005 257/295 |
| 11,791,233 | B1* | 10/2023 | Mathuriya | H10B 53/20 257/295 |
| 11,829,699 | B1* | 11/2023 | Mathuriya | H01L 25/105 |
| 11,841,757 | B1* | 12/2023 | Mathuriya | H10B 51/20 |
| 11,842,132 | B1* | 12/2023 | Chen | G06F 30/3315 |
| 11,899,613 | B1* | 2/2024 | Mathuriya | H01L 23/5385 |
| 11,916,020 | B2* | 2/2024 | Elsherbini | H01L 23/5386 |
| 12,001,266 | B1* | 6/2024 | Mathuriya | H01L 23/3675 |
| 12,019,492 | B1* | 6/2024 | Mathuriya | G06F 9/54 |
| 12,026,034 | B1* | 7/2024 | Mathuriya | H01L 25/16 |
| 12,080,652 | B2* | 9/2024 | Elsherbini | H01L 23/5386 |
| 12,243,797 | B1* | 3/2025 | Mathuriya | G06F 1/3203 |
| 12,327,816 | B2* | 6/2025 | Lin | H01L 23/49811 |
| 2011/0080184 | A1* | 4/2011 | Wu | H01L 22/34 324/762.02 |
| 2011/0080185 | A1* | 4/2011 | Wu | G01R 31/2601 257/E23.145 |
| 2015/0101856 | A1* | 4/2015 | Maling | H05K 1/115 174/262 |
| 2016/0379958 | A1* | 12/2016 | Kuroda | H01L 24/73 257/531 |
| 2017/0186734 | A1* | 6/2017 | Kim | H01L 23/522 |
| 2017/0352592 | A1* | 12/2017 | Farooq | H10D 1/043 |
| 2017/0352618 | A1* | 12/2017 | Fitzsimmons | H01L 23/49822 |
| 2018/0203963 | A1* | 7/2018 | Eghbal | G06F 30/3308 |
| 2020/0176419 | A1* | 6/2020 | Dabral | H01L 25/0657 |
| 2020/0219815 | A1* | 7/2020 | Elsherbini | H01L 25/0655 |
| 2021/0111124 | A1* | 4/2021 | Elsherbini | H01L 24/19 |
| 2022/0051987 | A1* | 2/2022 | Elsherbini | H01L 23/5386 |
| 2023/0116320 | A1* | 4/2023 | Felix | G01R 31/31716 257/686 |
| 2023/0282548 | A1* | 9/2023 | Vafai | H01L 24/73 257/712 |
| 2023/0343716 | A1* | 10/2023 | Elsherbini | H01L 25/50 |
| 2024/0006269 | A1* | 1/2024 | Vafai | H01L 25/0657 |
| 2024/0355750 | A1* | 10/2024 | Elsherbini | H01L 23/3675 |
| 2025/0165691 | A1* | 5/2025 | Zhong | G06F 30/367 |

FOREIGN PATENT DOCUMENTS

| | | | | |
|---|---|---|---|---|
| DE | 102021132253 A1 * | 6/2022 | | H01L 24/08 |
| DE | 102021132253 A9 * | 5/2023 | | H01L 25/18 |
| KR | 20170013310 A * | 2/2017 | | H01L 25/50 |

* cited by examiner

```
BLOCK_POWER_ASSIGNMENT (
soc_fullchip REGION AP VDD 1.35 997.500 1000.000 22830.000 27132.500
soc_fullchip REGION AP VDDQ 2.64 997.500 1000.000 22830.000 27132.500 hbm_region1 REGION AP VDDC 4.0 24700.000 15127.500 34702.500 27130.000
hbm_region2 REGION AP VDDQ 1.84 24700.000 15127.500 34702.500 27130.000

Interposer_fullchip REGION AP VSS 13.52 0 0 35700 28000
)
```

Net name — Power Consumption (W) — Bounding box coordinate

DETERMINING A DENSITY OF THROUGH-SILICON VIAS IN INTEGRATED CIRCUITS

RELATED APPLICATION

This present application claims the benefit of priority of U.S. Patent Application Ser. No. 63/262,957 entitled "DETERMINING A DENSITY OF THROUGH-SILICON VIAS IN INTEGRATED CIRCUITS" and filed Oct. 22, 2021, the contents of which are incorporated herein by reference in its entirety.

TECHNICAL FIELD

The present disclosure generally relates to an electronic design automation (EDA) system for integrated circuit (IC) design and, more particularly, to the determination and distribution of through-silicon vias (TSVs) on a die.

BACKGROUND

In a three-dimensional (3D) stacked IC, the power supply for higher layer (level) dies is supplied through at least some of the TSVs of at least one lower-layer die. The power supply comes from the bottom-most die, which is physically connected to a power source. TSVs may carry current vertically (upward or downward), supplying the IC modules or cells that consume power. Lateral connections are typically minimized for better power supply efficiency.

SUMMARY

In one aspect of the present disclosure, a method of determining a density of through-silicon vias (TSVs) for a die in a three-dimensional (3D) stacked die is disclosed. In some embodiments, the method may include: obtaining first power consumption information associated with a first die of the 3D stacked die; obtaining second power consumption information associated with a second die of the 3D stacked die; identifying, on the first die, an area associated with the second die, the identified area overlapping an area associated with the first die; and determining a density of TSVs for the identified area based at least on the first power consumption information and the second power consumption information.

In some embodiments, the method may include: identifying a first die and a second die, the second die disposed on a different layer from that of the first die; obtaining power consumption information associated with the first die and the second die; identifying, on the identified first die, a region associated with the second die; and determining a density of TSVs for the identified region associated with the second die based on the power consumption associated with the first die and the power consumption information associated with the second die.

In some embodiments, the method may include: identifying, on a first die, a region associated with the first die and a smallest region not yet processed; excluding the smallest region from the region associated with the first die to obtain a remaining region; obtaining power consumption information associated with the remaining region and power consumption information associated with the smallest region; and determining a density of TSVs for the smallest region based on a sum of the power consumption information associated with the remaining region and the power consumption information associated with the smallest region.

In some aspects of the present disclosure, a computerized apparatus is disclosed. In some embodiments, the computerized apparatus may include: memory; and one or more processor apparatus configured to perform operations including those recited in the above embodiments.

In some aspects of the present disclosure, a non-transitory computer-readable apparatus is disclosed. In some embodiments, the non-transitory computer-readable apparatus may include a storage medium having instructions configured to, when executed by one or more processor apparatus, cause a computerized apparatus or the one or more processor apparatus to perform operations including those recited in the above embodiments.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 2 is a table illustrating examples of parameters for regions of a die.

DETAILED DESCRIPTION

Aspects of the present disclosure relate to stacked three-dimensional (3D) integrated circuits (ICs) and more specifically to determining a density of through-silicon vias (TSVs) on different layers of the 3D IC for efficient power supply. The three-dimensional nature of the 3D IC introduces a design challenge to distribute TSVs in a way that provides power to all layers of the 3D IC, including sufficient power to higher-layer dies. More specifically, the TSV density of a lower-layer die should provide sufficient power supply to the upper-layer dies. Further, the required power not only differs between dies, but also varies in regions.

The present disclosure provides a simplified approach to determining how many TSVs are needed in each layer of a complex, stacked IC such as a 3D IC. This is done by using power information of each die or layer of the stacked IC. Technical advantages of the present disclosure include, but are not limited to, making the determination and generation of TSVs systematic based on information of each die of a stacked IC. As will be described in greater detail below, the systematic determination may be done by examining power information layer by layer.

Figure 1:
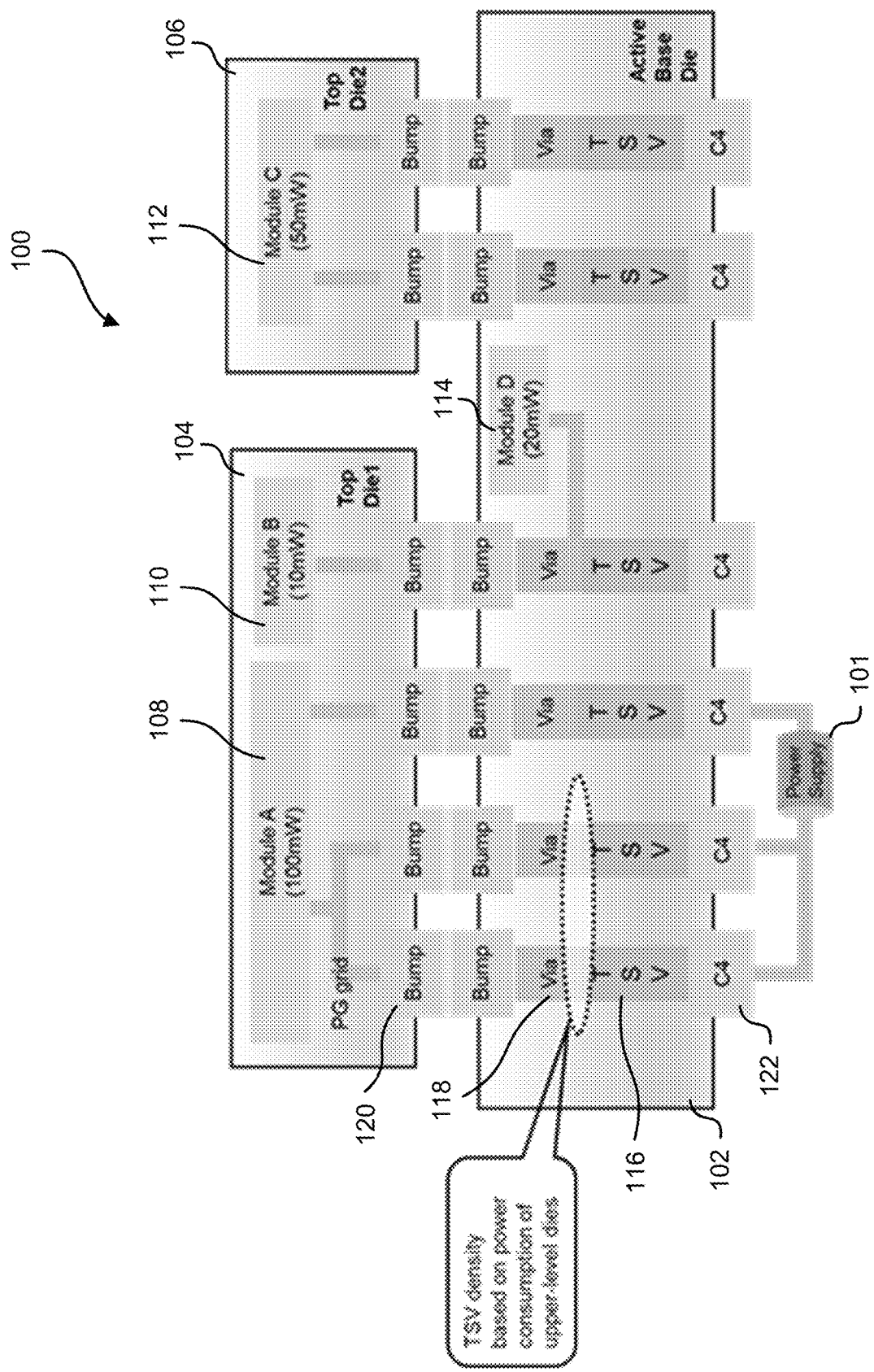
FIG. 1 is a schematic illustrating a 3D IC, with which embodiments described herein may be used.

FIG. 1 is a block schematic illustrating a 3D IC driven by a power supply, according to one embodiment. In some embodiments, a 3D IC 100 may include a lower die (e.g., active base die 102) and one or more upper dies (e.g., top die 104 and top die 106). In varying implementations, each die may include one or more modules (electronic components, transistors, etc.), e.g., modules A through D 108, 110, 112, 114 as shown in FIG. 1. The lower die supplies power for the one or more upper dies as well as itself. Power may be delivered via TSVs 116 and vias 118. In different embodiments, TSVs 116 may be hollow or filled conductive trenches that have a larger pitch (e.g., center-to-center distance of 10-30 microns) compared to that of other vias 118 (e.g., nanometer scale). Although not shown in detail in FIG. 1, each TSV may conduct power or signals to or from other layers using numerous vias, given the difference in pitch. Power and signal delivery between layers and between power supply 101 may be conducted via solder bumps 120 and/or other interconnects, e.g., controlled collapse of chip connection (C4) 122.

The required power not only differs between dies, but also varies in regions. As an example, module A (108) may require, and/or be capable of consuming during operation, 100 mW. Module B (110) may require 10 mW of power. Both modules may be used by one upper die 104. Other modules (e.g., 112, 114) in other dies may consume different amounts of power. Hence, power consumption varies among different regions of the 3D IC 100 which contain various modules and/or components requiring power in a complex stacking of dies. This TSV distribution problem may become unmanageable for manual designing given sufficient complexity. Techniques and solutions provided herein overcome this challenge as described below.

The present system may receive power consumption data for different regions of a die based on a power supply net name, a bounding box on the die, and a power consumption value (e.g., in watts (W)). The bounding box coordinates may represent boundaries of each region. For example, (997.500 and 1000.000) and (22830.000 and 27132.500) may represent two (x, y) coordinates that define a region (e.g., a rectangular region) on a die. FIG. 2 shows illustrative examples of the foregoing parameters for regions of a die. These parameters may be stored, read, and/or transmitted in any format, such as a comma-separated values (CSV) format, a tab-delimited format, a look-up table, etc.

In some instances, the present system may receive a current consumption (e.g., in amperes). Current may be converted to power by multiplying the current with the voltage (in volts) of the power supply using the equation power=current*voltage.

Each TSV in an IC design may have a certain specific resistance (R, in ohms) when manufactured. A given TSV may carry a certain amount of current (I, in amperes) leading to a voltage drop of V=IR volts. This is known as an IR drop, and it is desirable to keep the IR drop within a specified bound to ensure the reliability of the power supply. Consider an example in which two TSVs are used. The two TSVs (individually having a resistance R) will be parallel to each other, so their combined resistance is 0.5R. The IR drop would also be halved (V=I (0.5 R)) assuming that everything else about the design of the IC remains unchanged. Keeping the IR drop of a die to be less than an upper bound may be a design requirement. Therefore, to support higher power or current consumption, more TSVs will be needed. Given the power consumption in watts (or equivalently, amperes with a fixed supply voltage), the minimum number of TSVs required to satisfy the IR drop requirement may be determined with this principle.

Instead of referring to the power (or current) consumption of a module, a die may be evaluated using the power (or current) per unit area, referred to herein as "power density" (or current density) with the unit of watts per millimeter squared ($mm^2$). With this change in unit, the number of TSVs per $mm^2$, also referred to as TSV density, may be determined to satisfy the IR drop requirement.

The TSV density required to support the power consumption may be dependent on the resistance of the TSV, the IR drop requirement, and an additional safety margin to account for manufacturing variation. This may be determined in the following equation with a conversion factor:

Number_of_TSV per $mm^2$=ConversionFactor*PowerConsumption per $mm^2$ (Eqn. 1)

The conversion factor (ConversionFactor) relates to converting power density to TSV density, and, in different embodiments, may come from a chip designer's prior experience, a look-up table from a simulation result, a mathematical formula, etc. Different conversion factors may be used for different dies, modules, or regions.

As described above, the dies at a higher stacking layer may rely on the lower-layer TSVs to supply power. Given an area (e.g., a rectangular area) of a die, the power consumption of all upper dies vertically intersecting the area needs to be provided by the TSVs within the area. In addition, TSVs may also need to provide power supply to its own die. In some embodiments, to determine the TSV density of a given region of a die, the power density of all layers at the current and higher layers may be summed up, as represented by the following equation and as will be described further below:

Number_of_TSV per $mm^2$ for die at layer $k$=ConversionFactor*StackingSum(PowerConsumption per $mm^2$ for die at layer $k$ and above) (Eqn. 2)

where ConversionFactor may correspond to the aforementioned conversion factor, and StackingSum may correspond to a summation of the power consumption for the regions of all the dies at and above the layer k at which TSV density is being determined, where k is a positive integer.

In some embodiments, after computing the required TSV density, a manufacturing tool may also create the TSVs in the dies accordingly. In creating the TSVs, the tool may check against a minimum TSV pitch rule and/or other design rules to ensure that the TSV density can be implemented without any manufacturing rule violations. The minimum TSV pitch rule may refer to a rule or rules governing the distance between TSVs (e.g., center points) and/or widths of TSVs.

In some embodiments, the TSV density determination may be performed and repeated separately for VSS (or VEE) and VDD (or VCC), i.e., negative and positive power supply. In some embodiments, where there are multiple power supply domains, the determination may be repeated for each power domain.

Figure 3:
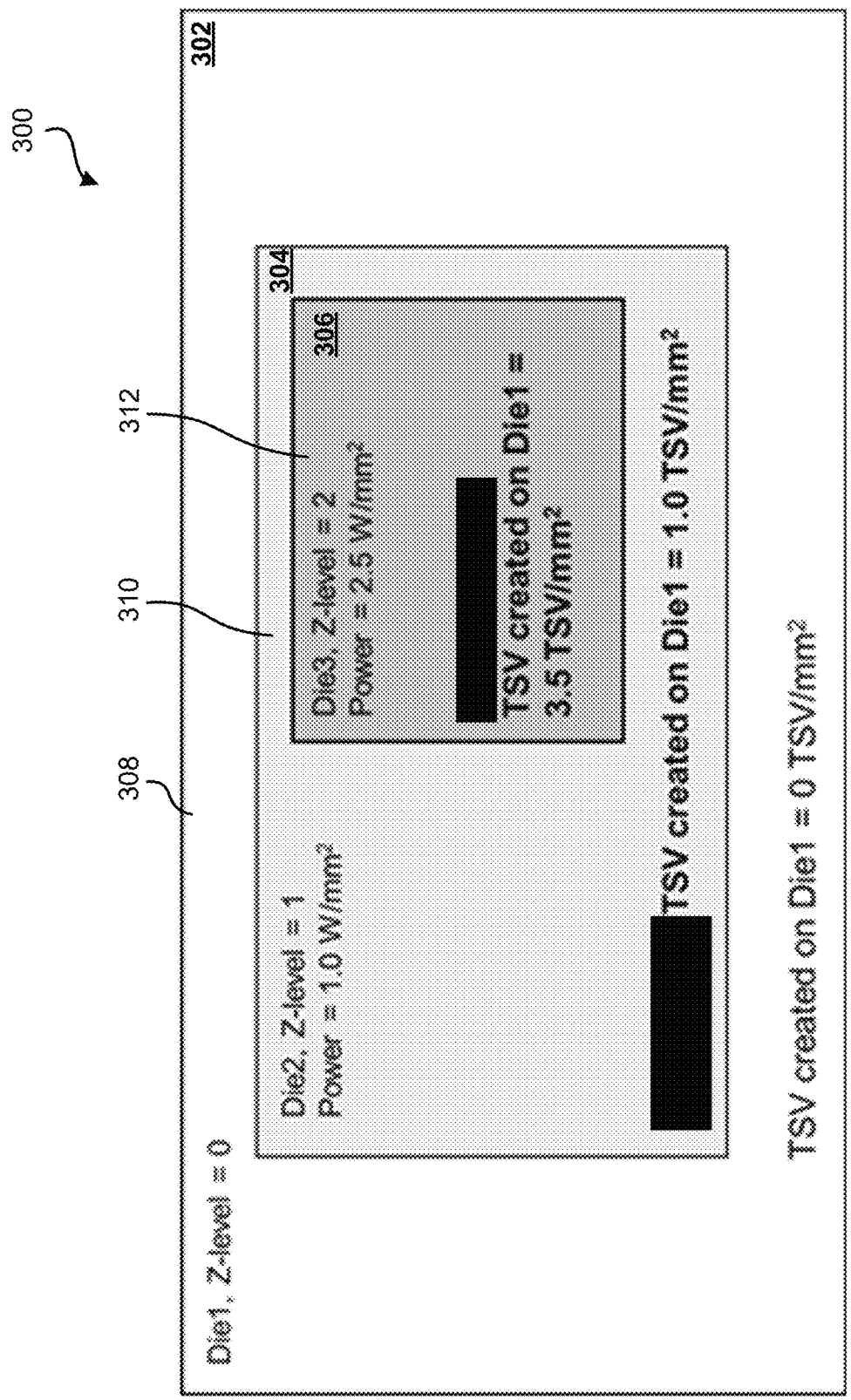
FIG. 3 is a block diagram illustrating an example 3D IC with multiple dies stacked on one another, according to one embodiment.

FIG. 3 is a block diagram illustrating an example 3D IC 300 with multiple dies stacked on one another, according to one embodiment. In the illustrated embodiment, the 3D IC may include three dies: a first die 302 on a first layer, a second die 304 on a second layer on top of the first die 302, and a third die 306 on a third layer on top of the second die 304. The first die 302 may include three regions: a first region 308, a second region 310, and a third region 312. The third region 312 on the first die 302 may correspond to that of the third die 306. The second region 310 on the first die 302 may correspond to that of the second die 304, excluding the third region 312. In other words, the second region 310 is bounded by the dimensions of the second die 304 but does not include the region of the third region 312. Similarly, the first region 308 on the first die 302 may correspond to the region of the first die 302, excluding the second region 310 and the third region 312. In other words, the first region 308 is bounded by the dimensions of the first die 302 but does not include the region of the second region 310 (which excludes the third region 312) and the third region 312.

In this example, the power density for the first die 302 may be 0 W/mm$^2$. As an aside, the interposer die (e.g., first die 302) may not consume power. The power density for the second die 304 may be 1.0 W/mm$^2$. The power density for the third die 302 may be 2.5 W/mm$^2$. Assuming ConversionFactor=1.0 (see Eqn. 1), the TSV density for the first, second, and third regions 308, 310, 312 may be as follows, respectively:

ConversionFactor*0 W/mm$^2$=0 TSV/mm$^2$;

ConversionFactor*1.0 W/mm$^2$=1.0 TSV/mm$^2$; and

ConversionFactor*(1.0+2.5)W/mm$^2$=3.5 TSV/mm$^2$.

Figure 4:
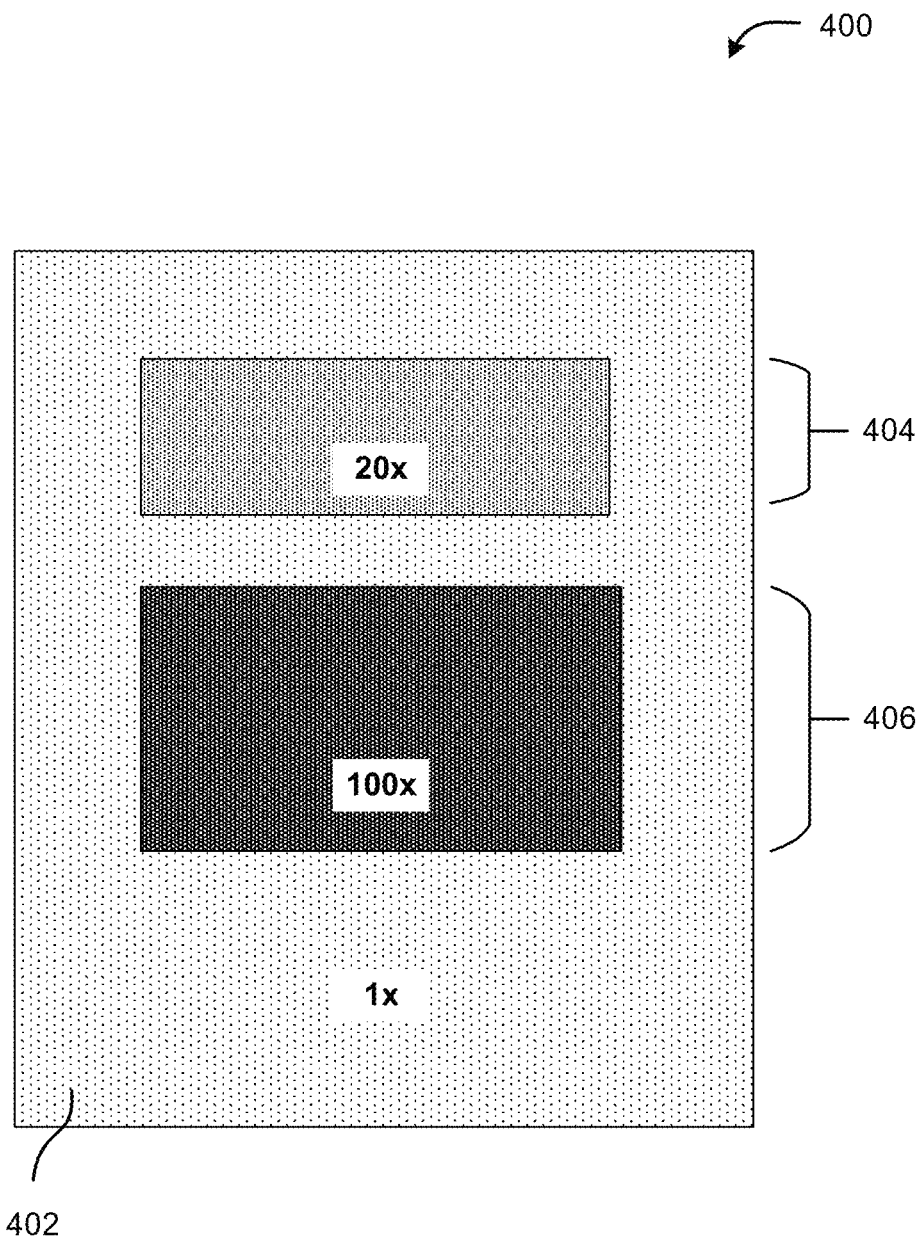
FIG. 4 is a schematic illustrating an example of regions distributed on a single stacked 3D die, each region having a different power consumption.

FIG. 4 illustrates an example of regions distributed on a single stacked 3D die, each region having a different power consumption. In the illustrated example die 400, there are three different power consumption regions 402, 404, 406. Region 402 is the base, bottom-most die. Region 404 may correspond to a die disposed on region 402. Region 406 may correspond to another die disposed on region 402. In various embodiments, myriad other region overlaps may exist, e.g., another die disposed on either or both of regions 404 or 406. In the shown example die 400, the power consumption of the base region 402 is some base amount. Region 404 may use, consume, or require 20 times the power consumption of base region 402 (20× the base amount), and region 406 may use, consume, or require 100 times the power consumption of base region 402 (100× the base amount). TSV densities of these regions 402, 404, 406 reflect these requirements. That is, region 404 may have a TSV density that is 20 times greater than the TSV density of region 402, and region 406 may have a TSV density that is 100 times greater than the TSV density of region 402. In some embodiments, each of the regions 402, 404, 406 may have a uniform distribution of TSVs.

Figures 5A, 5B:
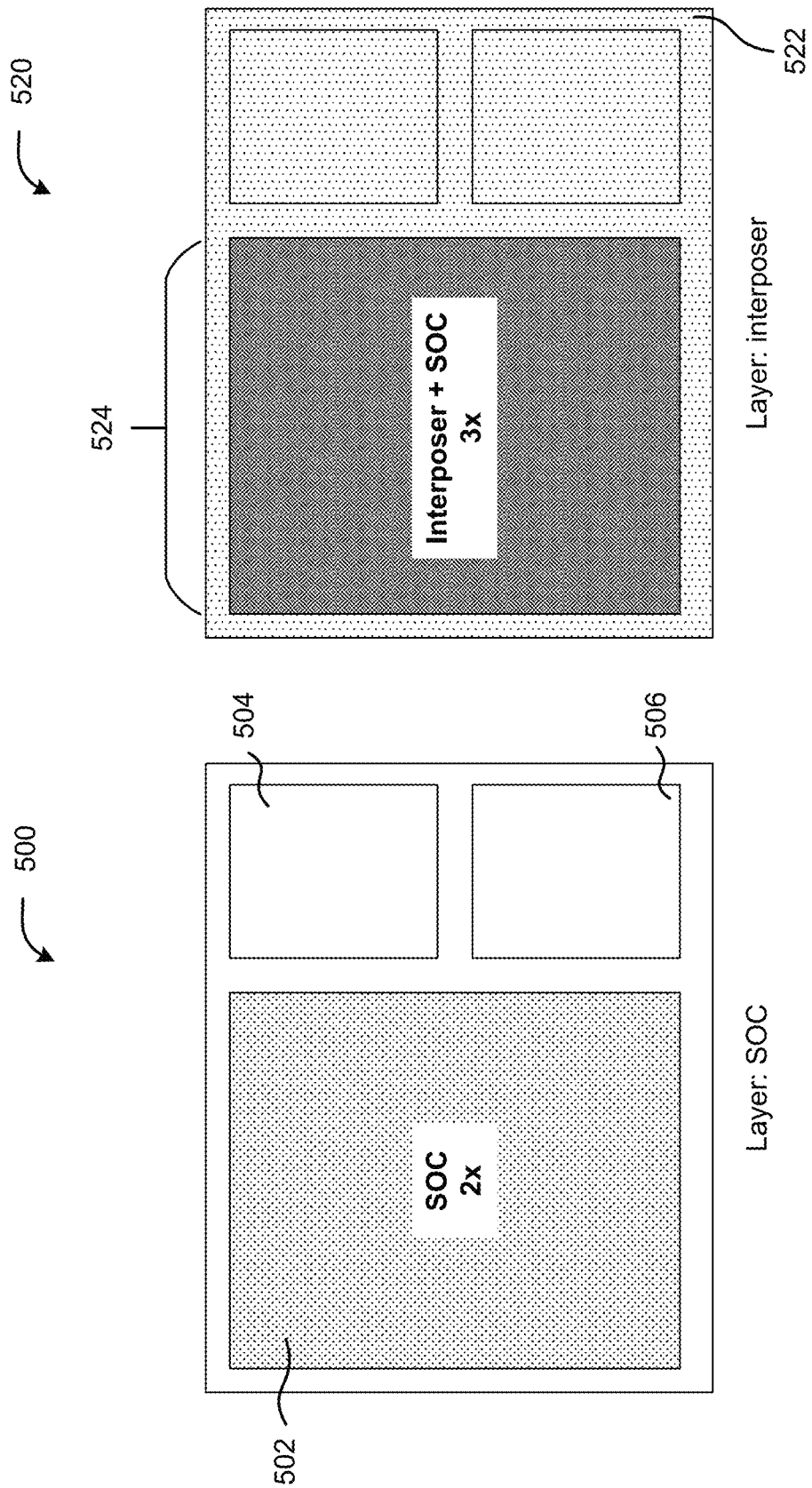
FIGS. 5A and 5B are schematics illustrating layers of an example stacked die having at least two layers.

FIGS. 5A and 5B illustrate layers of an example stacked die having at least two layers. FIG. 5A illustrates an upper layer 500 of the example die. The upper layer may include a system on a chip (SOC) 502. The base layer 520 may include an interposer die 522. An interposer or an interposer die may generally refer to a die configured to interface or route an electrical connection and/or connect an active die (e.g., SOC 502) to another. Accordingly, in some embodiments, an interposer die may only contain metal wires (to, e.g., provide power and signal connection to the other dies) and not contain, e.g., transistor devices and electronic modules, as opposed to an active die that may be adapted to, e.g., perform computations.

Hence, the SOC 502 may be disposed over the interposer die 522. The upper layer may further include one or more additional dies, e.g., 504 and/or 506. The power consumption or requirement of the SOC 502 may be twice (2×) as that of the interposer die 522. For the sake of illustration, the additional dies 504, 506 may not require or consume any power (and hence not require any TSVs in this instance).

Turning to FIG. 5B, which illustrates the base layer 520 of the example die, it can be seen that the region 524 of the base layer 520, where the region 524 corresponds to or overlaps with the SOC 502, may have a power usage, consumption, or requirement that is three times (3×) that of the remaining region of the base layer 520. The remaining region refers to the region on the interposer die 522 that excludes the overlapping region with region 524 (depicted as a dotted area, without the dark area associated with the region 524 for interposer+SOC). Put differently, the area of the remaining region would equal the total area of the interposer die 522 minus the area of the region 524 corresponding to the SOC 502. The power requirement for the region 524 is determined based on (i) the 2× power requirement of the SOC 502 in the upper layer compared to that (1×) of the interposer die 522, in addition to (ii) the 1× power requirement of the interposer die 522. The TSV density in the region 524 is, accordingly, three times that of the remaining region of the base layer 520. In some embodiments, each of the regions 502, 522, 524 may have a uniform distribution of TSVs.

Figure 6:
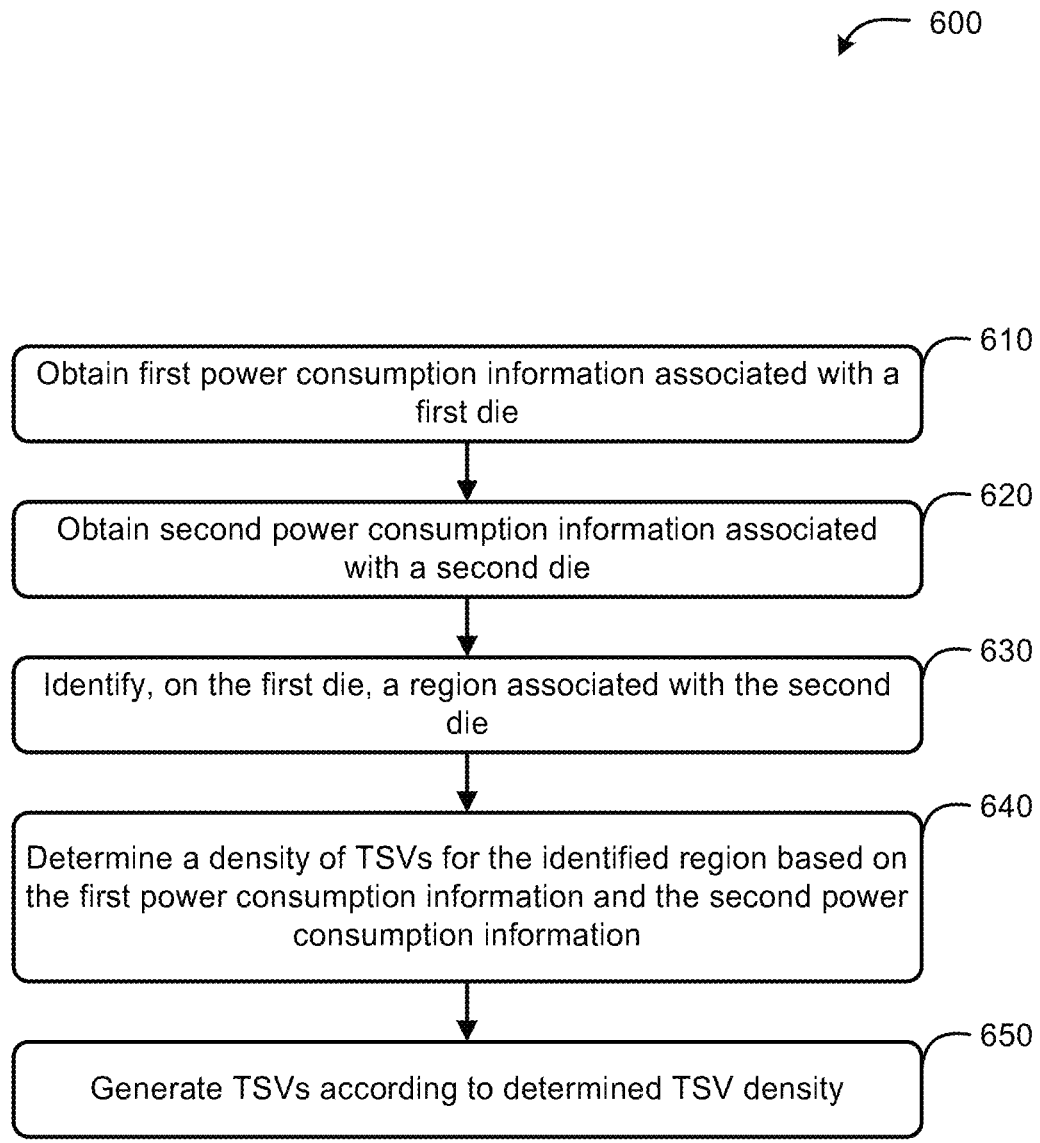
FIG. 6 depicts a flowchart of a methodology for determining a TSV density for a die in a 3D stacked die, according to one embodiment.
Figure 10:
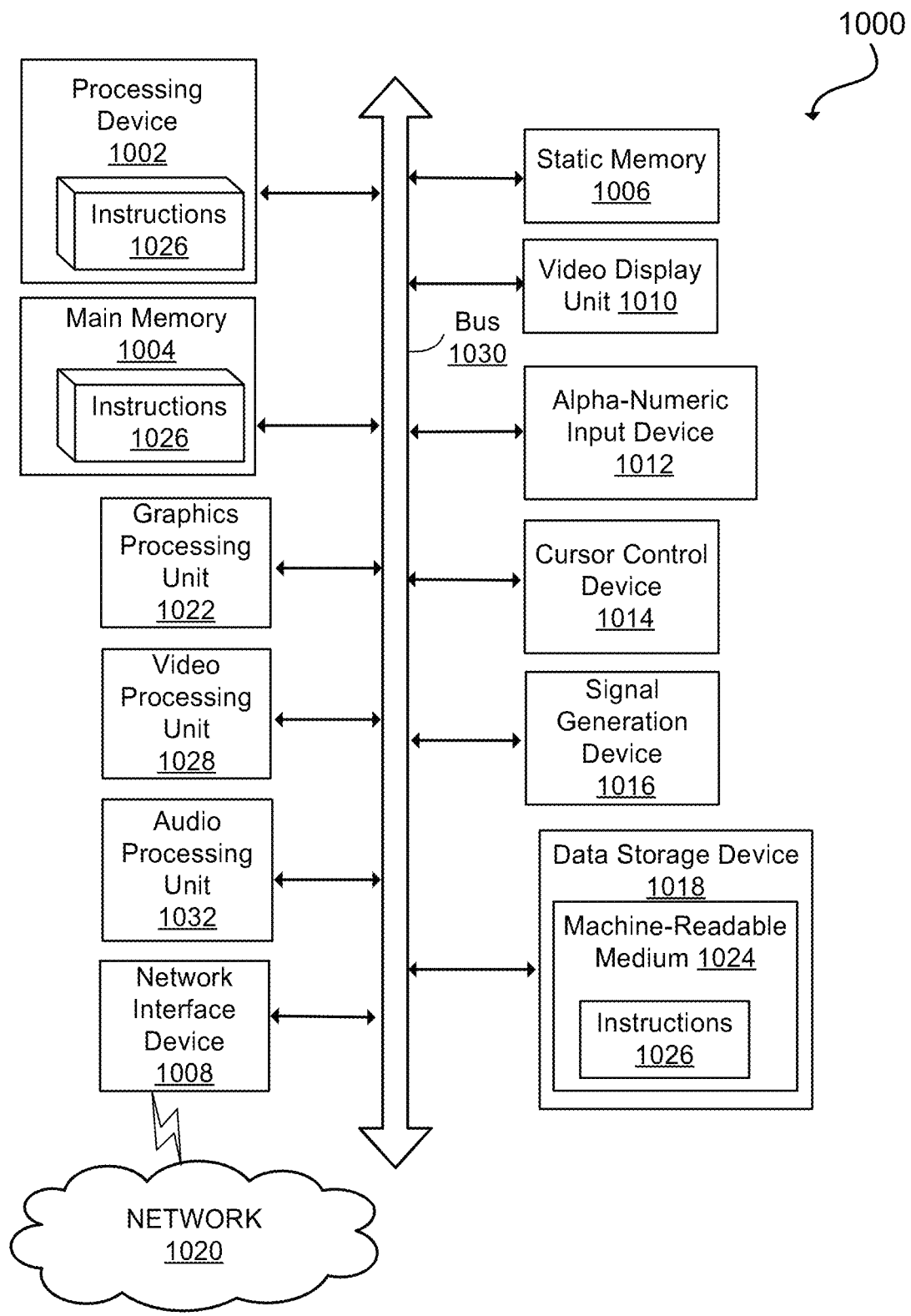
FIG. 10 depicts an example diagram of an example computer system in which embodiments of the present disclosure may operate.

FIG. 6 is a flow diagram illustrating one methodology 600 for determining a TSV density for a die in a three-dimensional (3D) stacked die, according to some embodiments. One or more of the functions of the method 600 may be performed by a computerized apparatus or system. Means for performing the functionality illustrated in one or more of the steps shown in FIG. 6 may include hardware and/or software components of such computerized apparatus or system, such as, for example, a device, a computer system, or a computer-readable apparatus including a storage medium storing computer-readable and/or computer-executable instructions that are configured to, when executed by a processor apparatus, cause the at least one processor apparatus or another apparatus to perform the operations. Example components of a computerized apparatus or system are illustrated in FIG. 10, which are described in more detail below.

It should also be noted that the operations of the method 600 may be performed in any suitable order, not necessarily the order depicted in FIG. 6. Further, the method 600 may include additional or fewer operations than those depicted in FIG. 6 to accomplish the determination of the TSV density.

At 610, the methodology 600 may include obtaining first power consumption information associated with a first die. In some embodiments, the first die may include a lower-layer die of the 3D stacked die. For example, in a two-layer die, the first die may correspond to the lower die, e.g., the die corresponding to region 402 of FIG. 4. In another example, in a three-layer die, the first die may correspond to the middle die or the lowest die, e.g., the die 302 or 304 of FIG. 3. The first power consumption information may include a power consumption or a power requirement of the first die measured or obtained in W, or a power density of the first die measured or obtained in W/mm$^2$ (or other units of power or relative to other units of area). In some embodiments, the first power consumption information may be associated with a region associated with the first die.

At 620, the methodology 600 may include obtaining second power consumption information associated with a second die. In some embodiments, the second die may include an upper-layer die of the 3D stacked die. For example, in a two-layer die, the second die may correspond to the upper die, e.g., the die corresponding to region 404 or 406 of FIG. 4. In another example, in a three-layer die, the second die may correspond to the middle die or the uppermost die, e.g., the die 304 or 306 of FIG. 3. The second power consumption information may include a power consumption or a power requirement of the second die measured or obtained in W, or a power density of the second die measured or obtained in $W/mm^2$ (or other units of power or relative to other units of area). In some embodiments, the second power consumption information may be associated with a region associated with the second die.

At 630, the methodology 600 may include identifying, on the first die, a region associated with the second die. In some embodiments, the region associated with the second die corresponds to the region on the first die over which the second die is disposed. The region associated with the second die may be an example of region 524 of FIG. 5 (which corresponds to SOC 502 disposed over the interposer die 522). A region associated with the first die may exclude the region associated with the second die, and the region associated with the first die may be an example of region 522 (excluding region 524).

At 640, the methodology 600 may include determining a density of TSVs for the identified region based on the first power consumption information and the second power consumption information. In some embodiments, the density of TSVs may correspond to a concentration of TSVs, e.g., in (number of TSVs)/$mm^2$ (or relative to other units of area). The TSV density may correlate directly to a power consumption for the identified region. In some embodiments, the power consumption for the identified region may be determined based on a summation of the first power consumption and the second power consumption. For example, if the power consumption or requirement for the first die (e.g., a lower-layer die) is 1.0 $W/mm^2$ and the power consumption or requirement for the second die (e.g., an upper-layer die) alone is 2.0 $W/mm^2$, the power consumption for the identified region would be 3.0 $W/mm^2$, which is three times that of the remaining portions of the first die. Hence, the density of TSVs for the identified region would also be three times that of the remaining regions of the first die, to support the power consumption of the first die and the second die (which has 2× the power consumption of the first die). The identified region in this scenario may be an example of region 524 of FIG. 5B (which has a 3× TSV density in that region compared to the rest of the interposer die 522.

At 650, the methodology 600 may include generating TSVs according to the determined density of TSVs. In some embodiments, the TSVs may be generated such that TSVs are placed substantially evenly in a given region (e.g., the identified region), e.g., in an array pattern. In some embodiments, the TSVs may be generated unevenly, e.g., in patches, while maintaining the overall concentration or density of TSVs within the identified region according to the density determined in 640.

In some embodiments, at least a portion of methodology 600 may be repeated with respect to a third die or layer, a fourth die or layer, etc. That is, a TSV density for a region corresponding to an additional die may be determined. More specifically, for example, the 3D stacked die may include a third die disposed over the second die, which may be disposed over the first die in turn. In this case, the methodology 600 may further include obtaining third power consumption information for the third die, and determining the TSV density for the region corresponding to the third die. Further, in this case, the TSV density for at least a portion of the region associated with the second die (e.g., as identified in step 630) may be adjusted such that identified region excludes the area corresponding to the third die. Referring back to FIG. 3 as an illustrative example, the first region 308 (corresponding to the first die 302) does not include the second region 310 or the third region 312. The second region 310 does not include the third region 312. Each of the first, second, and third regions 308, 310, 312 will have its own respective TSV density on the first die 302, as indicated in FIG. 3 (e.g., 0 $TSV/mm^2$, 1.0 $TSV/mm^2$ and 3.5 $TSV/mm^2$, respectively). The TSV densities of the other dies (second, third, etc.) may be determined with the same approach as above.

Figure 7:
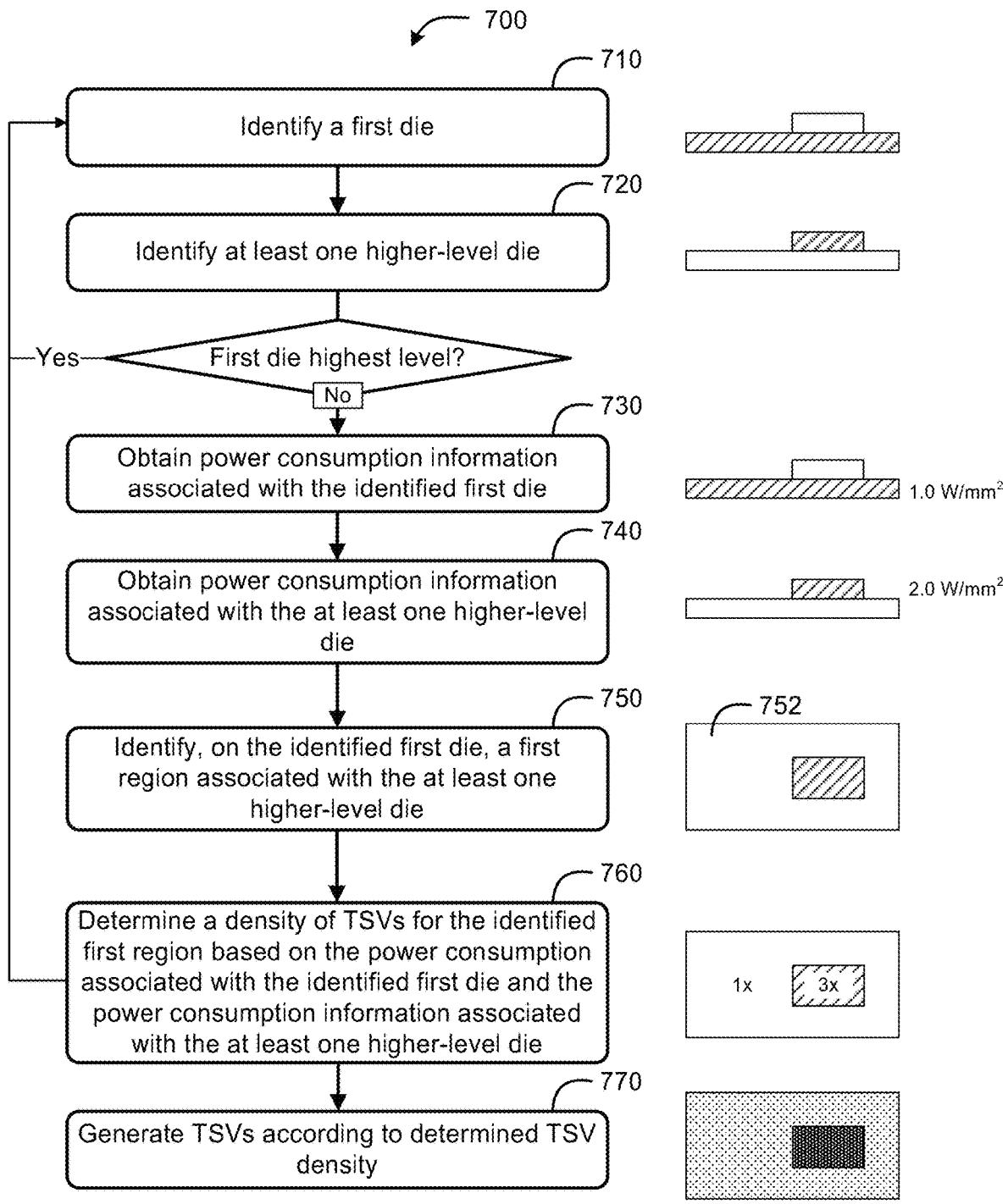
FIG. 7 depicts a flowchart of a methodology for determining a TSV density for a die in a 3D stacked die, according to another embodiment.

FIG. 7 is a flow diagram illustrating one methodology 700 for determining a TSV density for a die in a three-dimensional (3D) stacked die, according to some embodiments. One or more of the functions of the method 700 may be performed by a computerized apparatus or system. Means for performing the functionality illustrated in one or more of the steps shown in FIG. 7 may include hardware and/or software components of such computerized apparatus or system, such as, for example, a device, a computer system, or a computer-readable apparatus including a storage medium storing computer-readable and/or computer-executable instructions that are configured to, when executed by a processor apparatus, cause the at least one processor apparatus or another apparatus to perform the operations. Example components of a computerized apparatus or system are illustrated in FIG. 10, which are described in more detail below.

It should also be noted that the operations of the method 700 may be performed in any suitable order, not necessarily the order depicted in FIG. 7. Further, the method 700 may include additional or fewer operations than those depicted in FIG. 7 to accomplish the determination of the TSV density.

At 710, the methodology 700 may include identifying a first die. A 3D IC system includes multiple dies, e.g., stacked together. Although any given die may be selected for evaluating its power consumption, in some embodiments, the highest-layer die that has not yet been evaluated may be identified and selected. However, the methodology may revert to the beginning if a higher-layer die cannot be identified, as described below.

At 720, the methodology 700 may include identifying at least one higher-layer die. The higher-layer die may be a second die that is on a different layer die than the identified first die. For example, if the die identified in step 710 is the lowest-layer die of a three-layer die, the higher-layer die may be the middle-layer die or the uppermost die. If the die identified in 710 is the highest-layer die, then the methodology may revert to 710 to identify another die. If there are no more dies to identify, i.e., all the dies have been evaluated, the process is complete.

At 730, the methodology 700 may include obtaining power consumption information associated with the identified first die. The power consumption information may include a power consumption or a power requirement of the identified first die measured or obtained in W, or a power density of the identified first die measured or obtained in $W/mm^2$ (or other units of power or relative to other units of area). In some embodiments, this power consumption information may be associated with a region associated with the identified first die.

At 740, the methodology 700 may include obtaining power consumption information associated with the at least one higher-layer die. The power consumption information may include a power consumption or a power requirement of the at least one higher-layer die measured or obtained in W, or a power density of the at least one higher-layer die measured or obtained in W/mm$^2$ (or other units of power or relative to other units of area). In some embodiments, this power consumption information may be associated with a region associated with the at least one higher-layer die.

At 750, the methodology 700 may include identifying, on the identified first die, a first region associated with the at least one higher-layer die. The first region associated with the at least one higher-layer die may be an example of the region 524 corresponding to SOC 502 of FIG. 5. In some embodiments, a second region associated with the identified first die may be determined (e.g., blank area 752 without hash marks in FIG. 7), where the second region corresponds to the area of the first die excluding the identified first region associated with the at least one higher-layer die. The second region may be an example of region 522 of FIG. 5, without region 524. In other words, continuing to use the example of FIG. 5, the area of the second region may be determined as follows: ((length×width) of interposer die 522)–(area of region 524).

At 760, the methodology 700 may include determining a density of TSVs for the identified first region based on the power consumption associated with the identified first die and the power consumption information associated with the at least one higher-layer die. In some embodiments, the density of TSVs may correspond to a concentration of TSVs, e.g., in (number of TSVs)/mm$^2$ (or relative to other units of area). The TSV density may correlate directly to a power consumption for the corresponding region of interest (e.g., the identified first region). In some embodiments, the power consumption for the region of interest (e.g., the identified first region) may be determined based on a summation of the power consumption associated with the identified first die and the power consumption information associated with the at least one higher-layer die. For example, if the power consumption or requirement associated with the identified first die is 1.0 W/mm$^2$ and the power consumption or requirement associated with the at least one higher-layer die alone is 2.0 W/mm$^2$, the power consumption for the identified first region would be 3.0 W/mm$^2$, which is three times that of the remaining portions of the identified first die. Accordingly, the density of TSVs for the identified first region of the identified first die would also be three times that of the remaining regions of the identified first die.

At 770, the methodology 700 may include generating TSVs according to the determined density of TSVs. In some embodiments, the TSVs may be generated such that TSVs are placed substantially evenly in a given region (e.g., the identified first region), e.g., in an array pattern. In some embodiments, the TSVs may be generated unevenly, e.g., in patches, while maintaining the overall concentration or density of TSVs within the identified first region according to the density determined in 760.

In some embodiments, at least a portion of the steps of methodology 700 may be applied or repeated with respect to a third die or layer, a fourth die or layer, etc. The TSV densities of the other dies (second, third, etc.) may be determined accordingly.

Figure 8:
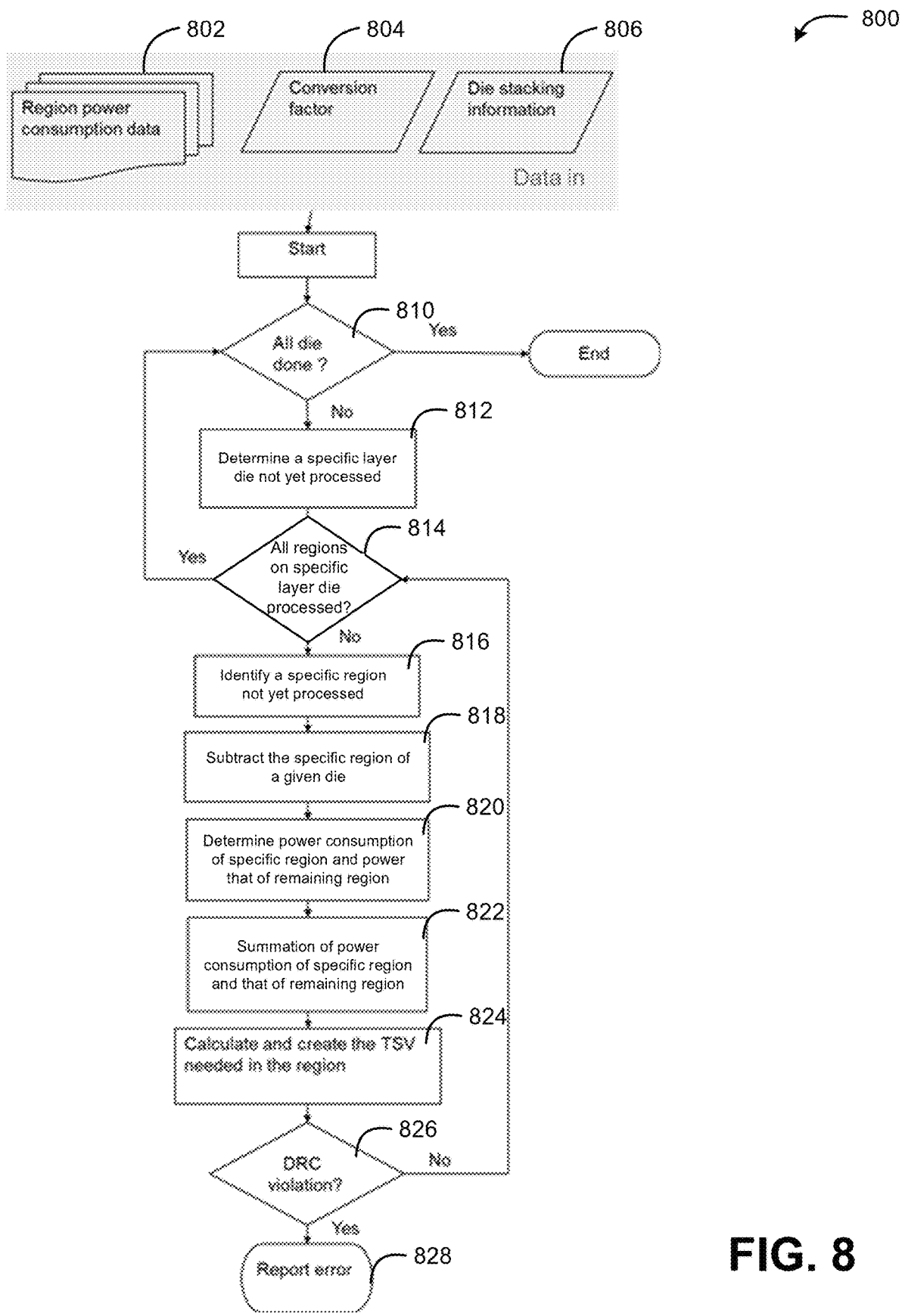
FIG. 8 depicts a flowchart of a methodology for determining a TSV density for a die in a 3D stacked die, according to another embodiment.

FIG. 8 is a flow diagram illustrating one methodology 800 for determining a TSV density for a die in a three-dimensional (3D) stacked die, according to some embodiments. One or more of the functions of the method 800 may be performed by a computerized apparatus or system. Means for performing the functionality illustrated in one or more of the steps shown in FIG. 8 may include hardware and/or software components of such computerized apparatus or system, such as, for example, a device, a computer system, or a computer-readable apparatus including a storage medium storing computer-readable and/or computer-executable instructions that are configured to, when executed by a processor apparatus, cause the at least one processor apparatus or another apparatus to perform the operations. Example components of a computerized apparatus or system are illustrated in FIG. 10, which are described in more detail below.

It should also be noted that the operations of the method 800 may be performed in any suitable order, not necessarily the order depicted in FIG. 8. Further, the method 800 may include additional or fewer operations than those depicted in FIG. 8 to accomplish the determination of the TSV density.

In some embodiments, the methodology 800 may begin with inputting data to, e.g., initialize the process of determining TSV density. In some embodiments, power consumption data 802, at least one conversion factor 804, and/or die stacking information 806 may be provided. Power consumption data 802 may include a power consumption or a power requirement of some or all of the dies in the 3D stacked die, measured or obtained in W, or a power density of the some or all of the dies, measured or obtained in W/mm$^2$ (or other units of power or relative to other units of area). Conversion factor 804 may include aforementioned data relating to converting power density to TSV density, and may come from a chip designer's prior experience, a look-up table from a simulation result, a mathematical formula, etc. Die stacking information 806 may include parameters relating to dimensions (e.g., length, width, height), or positions or locations (e.g., relative and/or absolute) of some or all of the dies in the 3D stacked die.

At 810, the methodology 800 may include determining whether all dies of the 3D stacked die have been processed. In some embodiments, processing may refer to determination of TSV density for regions corresponding to the dies. If all the dies have been processed, the process ends. If not all the dies have been processed, the process proceeds to 812.

At 812, the methodology 800 may include, with respect to a given die, identifying a specific layer die (e.g., from a highest layer die to a lowest layer die) not yet processed.

At 814, the methodology 800 may include determining whether all regions on the specific layer die have been processed. If all regions have been processed, the process returns to 810. If not all the regions have been processed, the process proceeds to 816.

At 816, the methodology 800 may include identifying a specific region (e.g., a smallest region) that has not yet been processed, e.g., on the given die. In some embodiments, regions and layers of dies may be identified (at some or all of 810-816) based on the die stacking information 806.

At 818, the methodology 800 may include excluding or subtracting out the specific region of the given die. The exclusion or subtraction may involve removing an overlap with another region (e.g., associate with the given die) so as to enable processing of the leftover surviving regions. For example, the specific region being excluded or subtracted may be the region 524 in FIG. 5B, and the remaining leftover region (after subtraction) may be the dotted area in FIG. 5B. In some embodiments, the leftover region may include at least one other region overlapping with the region associated with the given die. For example, the specific region may be the region 312 of FIG. 3, and the remaining leftover region may be regions 308 and 310 of FIG. 3.

At 820, the methodology 800 may include obtaining power consumption information associated with the specific region of the and power consumption information associated with the remaining leftover region (after subtraction of the specific region). The power consumption information associated with the remaining region may include power consumption information for at least one other region (e.g., associated with another die other than the specific layer die). The power consumption information may be obtained from, e.g., the power consumption data 802. In some embodiments, the power consumption information may include a power consumption or a power requirement. In some embodiments, the power consumption information may include a power density. In some embodiments, the power consumption information may include a power consumption, a power requirement, or a power density of dies associated with the regions.

At 822, the methodology 800 may include summing at least (i) the power consumption associated with the specific region and (ii) the power consumption associated with the remaining region. In some embodiments, as alluded to above, the power consumption associated with the remaining region may include multiple regions associated with corresponding multiple layers, with multiple corresponding power consumptions associated therewith. A combined power consumption or requirement may be determined thereby based on power consumptions associated with all regions or dies. Using FIG. 3 as an example, with die 306 as the specific die, a summation of 2.5 W/mm² associated with the specific region and 1.0 W/mm²+0 W/mm² associated with the remaining region may be made. As another example, with die 304 as the specific die, a summation of 1.0 W/mm² associated with the specific region and 0 W/mm² associated with the remaining region may be made. Using FIGS. 5A and 5B as an example, a summation of 2× power requirement for the SOC 502 and 1× power requirement for the interposer 522 may be made.

At 824, the methodology 800 may include determining the TSV density of the specific region, based at least on the combined power consumption or requirement determined at 822, and creating the TSVs accordingly in the specific region. In some embodiments, the TSVs may be created so as to be substantially evenly distributed, e.g., in an array. In some embodiments, the determined TSV density may be proportional to the combined power consumption or requirement. For example, if the smallest region has a power consumption that is 2.5× that of the remaining region, then the TSV density of the smallest region may also be 2.5× that of the remaining region. In some embodiments, the determination may be further based on a conversion factor 804, and the determination may be made according to the following:

Number_of_TSV per mm²=ConversionFactor*StackingSum(Power-Consumption per mm² at the current die and dies above) (Eqn. 3)

Number_of_TSV=Number_of_TSV per mm²*RegionArea (Eqn. 4)

At 826, the methodology 800 may include determining whether a design rule checking (DRC) violation has occurred. In some embodiments, a manufacturing tool, for example, may check against a minimum TSV pitch rule and/or other design rules to ensure that the TSV density can be implemented without any manufacturing rule violations.

For example, the distance between the TSVs may be checked to determine that no design rule is violated. If a DRC violation is detected, an error may be generated, stored in memory, and/or reported to a user, at 828. If no violation is detected, the process returns to 814 to determine whether all regions have been processed, and may repeat in an iterative process.

To illustrate the foregoing steps, refer to the three-layer 3D stacked die illustrated in FIG. 3 as an example. Take the perspective of the first die 302. The highest-layer die not yet processed may correspond to die 306. Hence, the smallest region not yet processed may correspond to region 312. The power density associated with the smallest region may be 2.5 W/mm². The power densities associated with the remaining region (excluding region 312) may be 0 and 1.0 W/mm². These power densities may be summed and combined to yield 3.5 W/mm², and the TSV density may correspond to 3.5 TSV/mm² assuming a conversion factor of 1.0.

Figure 9:
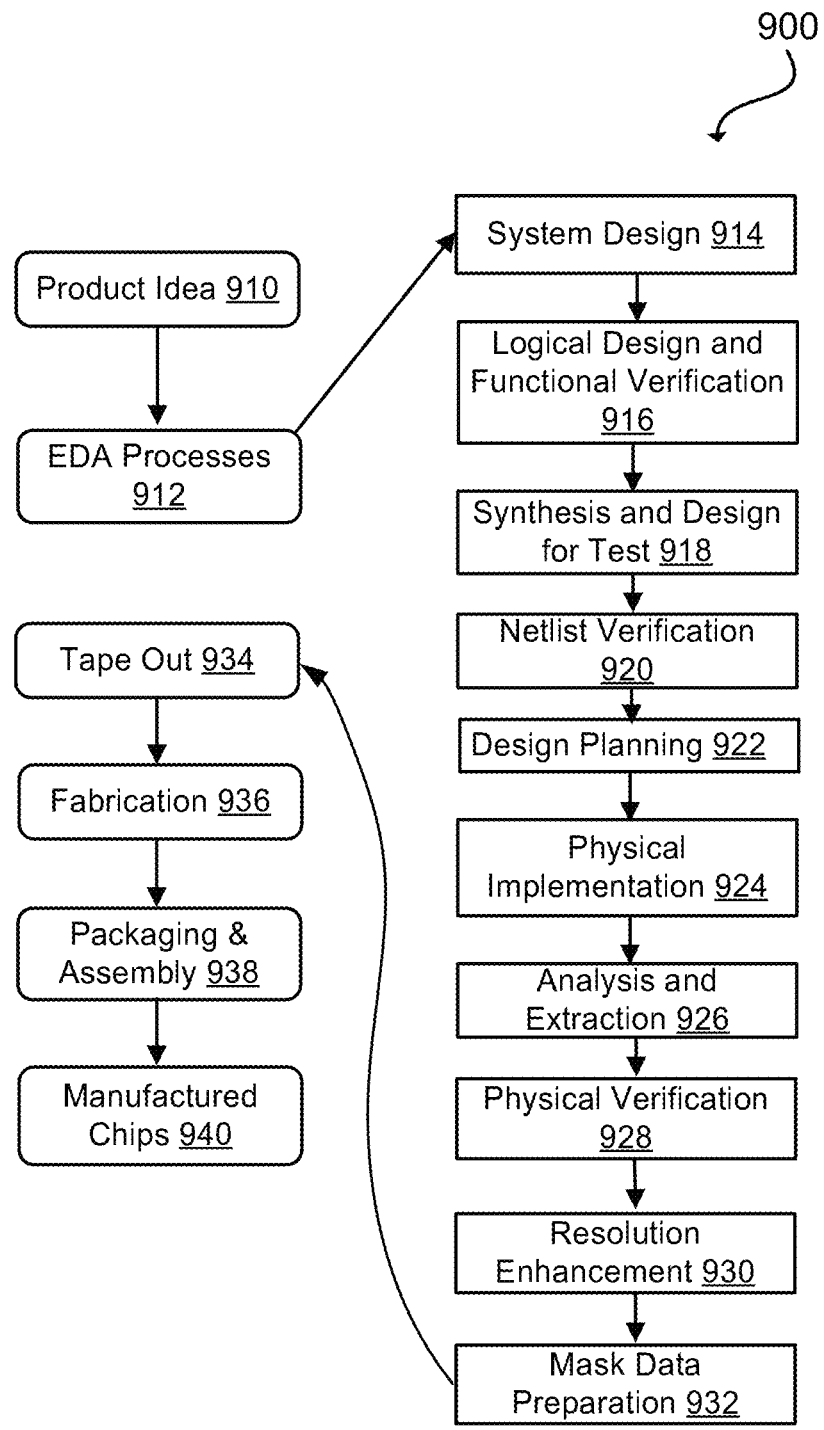
FIG. 9 depicts a flowchart of various processes used during the design and manufacture of an integrated circuit in accordance with some embodiments of the present disclosure.

FIG. 9 illustrates an example set of processes 900 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 910 with information supplied by a designer, information which is transformed to create an article of manufacture that uses a set of EDA processes 912. When the design is finalized, the design is taped-out 934, which is when artwork (e.g., geometric patterns) for the integrated circuit is sent to a fabrication facility to manufacture the mask set, which is then used to manufacture the integrated circuit. After tape-out, a semiconductor die is fabricated 936 and packaging and assembly processes 938 are performed to produce the finished integrated circuit 940.

Specifications for a circuit or electronic structure may range from low-level transistor material layouts to high-level description languages. A high-level of representation may be used to design circuits and systems, using a hardware description language ('HDL') such as VHDL, Verilog, System Verilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 5. The processes described by be enabled by EDA products (or tools).

During system design 914, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 916, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 918, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 920, the netlist is checked for compliance with timing constraints and for correspondence with the HDL code. During design planning 922, an overall floor plan for the integrated circuit is constructed and analyzed for timing and top-level routing.

During layout or physical implementation 924, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 926, the circuit function is verified at the layout level, which permits refinement of the layout design. During physical verification 928, the layout design is checked to ensure that manufacturing constraints are correct, such as DRC constraints, electrical constraints, lithographic constraints, and that circuitry function matches the HDL design specification. During resolution enhancement 930, the geometry of the layout is transformed to improve how the circuit design is manufactured.

During tape-out, data is created to be used (after lithographic enhancements are applied if appropriate) for production of lithography masks. During mask data preparation 932, the 'tape-out' data is used to produce lithography masks that are used to produce finished integrated circuits.

A storage subsystem of a computer system (such as computer system 900 of FIG. 6) may be used to store the programs and data structures that are used by some or all of the EDA products described herein, and products used for development of cells for the library and for physical and logical design that use the library.

FIG. 10 illustrates an example machine of a computer system 1000 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM), a static memory 1006 (e.g., flash memory, static random access memory (SRAM), etc.), and a data storage device 1018, which communicate with each other via a bus 1030.

Processing device 1002 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 may also be one or more special-purpose processing devices such as an application specific integrated circuit (ASIC), a field programmable gate array (FPGA), a digital signal processor (DSP), network processor, or the like. The processing device 1002 may be configured to execute instructions 1026 for performing the operations and steps described herein.

The computer system 1000 may further include a network interface device 1008 to communicate over the network 1020. The computer system 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), a graphics processing unit 1022, a signal generation device 1016 (e.g., a speaker), graphics processing unit 1022, video processing unit 1028, and audio processing unit 1032.

The data storage device 1018 may include a machine-readable storage medium 1024 (also known as a non-transitory computer-readable medium) on which is stored one or more sets of instructions 1026 or software embodying any one or more of the methodologies or functions described herein. The instructions 1026 may also reside, completely or at least partially, within the main memory 1004 and/or within the processing device 1002 during execution thereof by the computer system 1000, the main memory 1004 and the processing device 1002 also constituting machine-readable storage media.

In some implementations, the instructions 1026 include instructions to implement functionality corresponding to the present disclosure. While the machine-readable storage medium 1024 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1002 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

The invention claimed is:

1. A method of determining a density of through-silicon vias (TSVs) for a die in a three-dimensional (3D) stacked die, comprising:
    obtaining first power consumption information associated with a first die of the 3D stacked die;
    obtaining second power consumption information associated with a second die of the 3D stacked die;
    identifying, on the first die, an area associated with the second die, the identified area overlapping an area associated with the first die; and
    determining a density of TSVs for the identified area based at least on the first power consumption information and the second power consumption information.

2. The method of claim 1, further comprising generating the TSVs according to the determined density of TSVs.

3. The method of claim 2, wherein the generated TSVs are placed substantially evenly on the die.

4. The method of claim 1, wherein the first die is associated with a first layer of the 3D stacked die, the second die is associated with a second layer of the 3D stacked die, and the second layer is smaller in area as compared to the first layer.

5. The method of claim 1, further comprising subtracting the identified area of the first die from the first die to result in a remaining area.

6. The method of claim 1, further comprising:
    obtaining a third power consumption information associated with a third die of the 3D stacked die; and
    determining a density of TSVs for an area associated with the third die on the first die.

7. The method of claim 1, wherein at least one of the first die or the second die does not consume power.

8. A system comprising:
    a memory storing instructions; and
    a processor, coupled with the memory and configured to execute the instructions to cause the system to:
        identify a first die and a second die, the second die disposed on a different layer from that of the first die;
        obtain power consumption information associated with the first die and the second die;
        identify, on the first die, a region associated with the second die; and
        for a three-dimensional stacked die, determine a density of through-silicon vias (TSVs) for the identified region associated with the second die based on the power consumption information associated with the first die and the power consumption information associated with the second die.

9. The system of claim 8, wherein the instructions further cause the processor to generate the TSVs according to the determined density of TSVs.

10. The system of claim 8, wherein the first die is associated with a first layer of the 3D stacked die, the second die is associated with a second layer of the 3D stacked die, and the second layer is smaller in area as compared to the first layer.

11. The system of claim 8, wherein the instructions further cause the processor to subtract the identified region of the first die from the first die to result in a remaining area.

12. The system of claim 8, further comprising:
   obtaining power consumption information associated with a third die of the 3D stacked die; and
   determining a density of TSVs for a region associated with the third die on the first die.

13. The system of claim 12, wherein at least one of the first die, the second die, or the third die of the 3D stacked die does not consume power.

14. The system of claim 8, wherein at least one of the first die or the second die does not consume power.

* * * * *